US012648079B2

(12) United States Patent
Okamoto et al.

(10) Patent No.: US 12,648,079 B2
(45) Date of Patent: Jun. 2, 2026

(54) ELECTRICAL ELEMENT-MOUNTING SUBSTRATE AND ELECTRICAL DEVICE

(71) Applicant: KYOCERA Corporation, Kyoto (JP)

(72) Inventors: Kazuhiro Okamoto, Kirishima (JP);
Masamitsu Shibata, Fuchu (JP);
Sentaro Yamamoto, Kagoshima (JP);
Yuhei Matsumoto, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 187 days.

(21) Appl. No.: 18/293,247

(22) PCT Filed: Jul. 29, 2022

(86) PCT No.: PCT/JP2022/029326
§ 371 (c)(1),
(2) Date: Jan. 29, 2024

(87) PCT Pub. No.: WO2023/008566
PCT Pub. Date: Feb. 2, 2023

(65) Prior Publication Data
US 2024/0251505 A1 Jul. 25, 2024

(30) Foreign Application Priority Data
Jul. 30, 2021 (JP) ................................. 2021-126316

(51) Int. Cl.
*H05K 1/03* (2006.01)
*H05K 1/02* (2006.01)
*H05K 1/183* (2026.01)

(52) U.S. Cl.
CPC ......... *H05K 1/0353* (2013.01); *H05K 1/0203* (2013.01); *H05K 1/0274* (2013.01); *H05K 1/0306* (2013.01); *H05K 1/183* (2013.01)

(58) Field of Classification Search
CPC ..... H05K 1/0201–0212; H05K 1/0271; H05K 1/0274; H05K 1/0296; H05K 1/0298;
(Continued)

(56) References Cited

U.S. PATENT DOCUMENTS

2005/0236180 A1* 10/2005 Sarma .................. H05K 3/4629
257/E23.113
2006/0109632 A1* 5/2006 Berlin .................. H05K 1/0206
257/E23.105
(Continued)

FOREIGN PATENT DOCUMENTS

JP 2011-134777 A 7/2011
JP 2017-037929 A 2/2017
(Continued)

*Primary Examiner* — Amir A Jalali
(74) *Attorney, Agent, or Firm* — Volpe Koenig

(57) ABSTRACT

The electrical element-mounting substrate includes a first substrate including a ceramic as a first base member, and a second substrate including an organic resin as a second base member. The first substrate has a first surface and a second surface opposite to the first surface. The first surface includes a first mounting region where an electrical element is mounted and an installation portion where a lens holder or a window material is installed. The installation portion is located around the first mounting region in a plan view. The second substrate is located on the second surface of the first substrate.

19 Claims, 9 Drawing Sheets

(58) Field of Classification Search
CPC .. H05K 1/0306; H05K 1/0313; H05K 1/0353;
H05K 1/182; H05K 1/183; H05K
2201/09009; H01L 23/10; H01L 23/367;
H01L 23/49568; H01L 23/49861; H01L
21/4807; H01L 21/4817; H01L 24/73;
H01L 25/073
See application file for complete search history.

(56) References Cited

U.S. PATENT DOCUMENTS

| | | | |
|---|---|---|---|
| 2012/0025269 A1* | 2/2012 | Parkhurst | H01L 23/367 |
| | | | 257/288 |
| 2012/0104524 A1* | 5/2012 | Takeshita | H10F 39/804 |
| | | | 257/E31.127 |
| 2012/0248294 A1* | 10/2012 | Kohama | H10F 39/806 |
| | | | 250/214 P |
| 2013/0128109 A1* | 5/2013 | Ichiki | H04N 23/55 |
| | | | 174/250 |
| 2017/0213940 A1* | 7/2017 | Sakai | H10F 77/50 |
| 2018/0376041 A1* | 12/2018 | Miura | H04N 23/55 |
| 2019/0333850 A1* | 10/2019 | Lin | H01L 23/49861 |
| 2020/0258924 A1* | 8/2020 | Takachi | H10F 39/199 |
| 2020/0344384 A1 | 10/2020 | Somei | |
| 2021/0273004 A1* | 9/2021 | Yoshida | H04N 25/00 |
| 2022/0059744 A1* | 2/2022 | Akiyama | H10H 20/857 |

FOREIGN PATENT DOCUMENTS

| | | | |
|---|---|---|---|
| JP | 2019-009381 A | 1/2019 |
| JP | 2020-004901 A | 1/2020 |
| WO | 2019-082923 A1 | 5/2019 |
| WO | 2019/087764 A1 | 5/2019 |

* cited by examiner

ELECTRICAL ELEMENT-MOUNTING SUBSTRATE AND ELECTRICAL DEVICE

TECHNICAL FIELD

The disclosed embodiments relate to an electrical element-mounting substrate and an electrical device.

BACKGROUND OF INVENTION

For example, an imaging device has been proposed in which an imaging element is mounted on a substrate in which a substrate made of a ceramic and a substrate made of an organic resin are layered.

CITATION LIST

Patent Literature

Patent Document 1: WO 2019/082923

SUMMARY

An electrical element-mounting substrate according to an aspect of an embodiment includes a first substrate including a ceramic as a first base member, and a second substrate including an organic resin as a second base member. The first substrate has a first surface and a second surface opposite to the first surface. The first surface includes a first mounting region where an electrical element is mounted and an installation portion where a lens holder or a window material is installed. The installation portion is located around the first mounting region in a plan view. The second substrate is located on the second surface of the first substrate.

DESCRIPTION OF EMBODIMENTS

In the following description, a substrate for mounting an imaging element is mainly taken as an example, but needless to say, the present invention can be applied to elements other than the imaging element. Examples of the element other than the imaging element include at least one element selected from the group consisting of a circuit element represented by a large-scale integrated circuit (LSI), a switch ASIC element, a superconducting element (Josephson element), a surface-acoustic-wave (SAW) element, a light-emitting element, a logic element, a Hall element, a light receiving element, a piezoelectric element, a Peltier element, and a metal-film resistive element. An electrical element to be mounted on a mounting region of an electrical element-mounting substrate is at least one of the above-described elements. That is, a plurality of elements of the same type or elements of different types may be mounted in the mounting region on the same surface. As described below, elements may be mounted on one surface or both surfaces of a second substrate. A plurality of elements may be mounted on both surfaces of the second substrate.

In an imaging device in which an imaging element is mounted on a layered substrate, for example, an optical axis of the imaging element may be shifted due to thermal deformation of the substrate, and there is room for improvement in durability.

Therefore, a mounting substrate for an imaging element and an imaging device having high durability are expected to be provided. In addition, when the above-described other elements are used, an electrical element-mounting substrate and an electrical device having high durability are expected to be provided.

Hereinafter, modes for implementing an electrical element-mounting substrate and an electrical device according to the present disclosure (hereinafter, referred to as "embodiments") will be described in detail with reference to the drawings. It should be noted that the electrical element-mounting substrate and the electrical device according to the present disclosure are not limited by the embodiments. Embodiments can be appropriately combined so as not to contradict each other in terms of processing content.

First Embodiment

Figure 1:
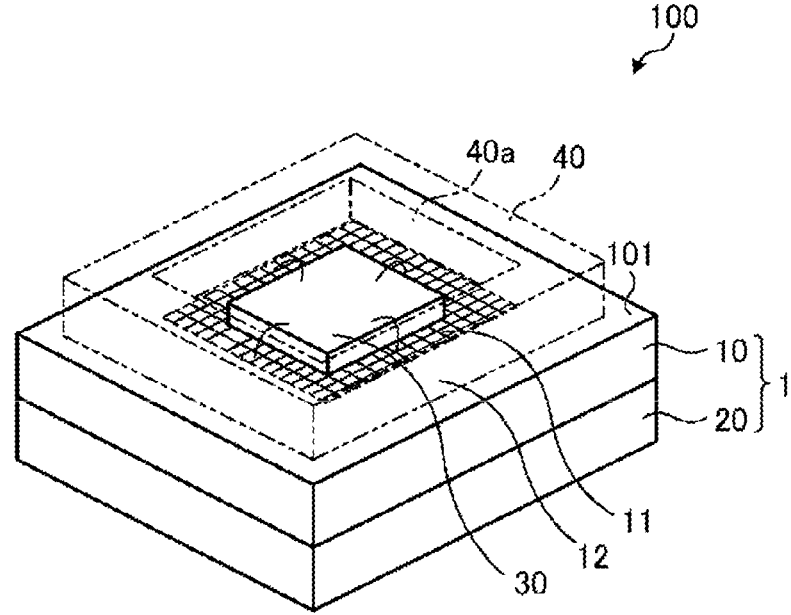
FIG. 1 is a perspective view illustrating an example of an electrical device according to a first embodiment.
Figure 2:
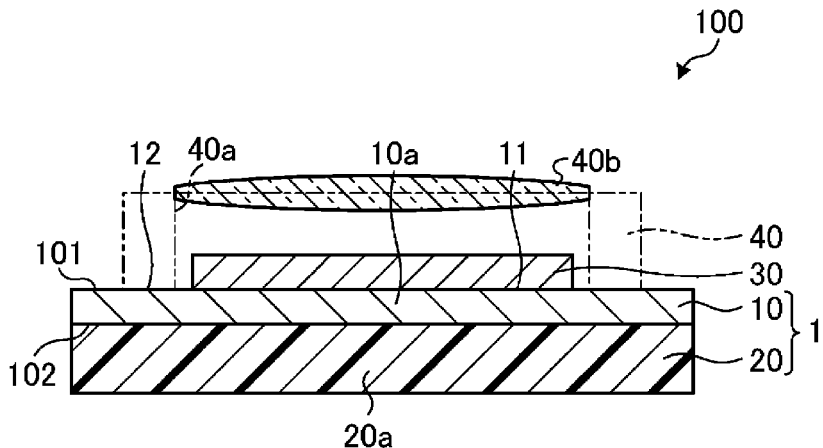
FIG. 2 is a cross-sectional view of the electrical device illustrated in FIG. 1.

FIG. 1 is a perspective view illustrating an example of the electrical device according to the first embodiment. FIG. 2 is a cross-sectional view of the electrical device illustrated in FIG. 1.

As illustrated in FIGS. 1 and 2, an electrical device 100 according to the first embodiment includes an electrical element-mounting substrate 1 and an imaging element 30. The electrical element-mounting substrate 1 includes a first substrate 10 and a second substrate 20. The electrical element-mounting substrate 1 serves as a substrate or a member where the imaging element 30 is mounted.

The first substrate 10 includes a ceramic as an insulating base member (first base member 10a). The first substrate 10 includes a mounting region 11 and an installation portion 12. The mounting region 11 is located in a center portion of a first surface 101, which is an upper surface of the first substrate 10. The mounting region 11 is a region in which the imaging element 30 is mounted. The mounting region 11 provided in the first substrate 10 may be referred to as a first mounting region. A surface of the first substrate 10 on which the mounting region 11 and the installation portion 12 are provided is referred to as the first surface 101, and a surface opposite to the first surface 101 is referred to as a second surface 102.

The installation portion 12 is located around the mounting region 11. In the case of the electrical element-mounting substrate 1 according to the first embodiment, the installation portion 12 is located on the first surface 101, which is the upper surface of the first substrate 10. That is, in the case of the electrical element-mounting substrate 1 according to the first embodiment, the mounting region 11 and the installation portion 12 are located on the same surface of the first surface 101. The mounting region 11 and the installation portion 12 are located at the same height on the first surface 101. Since the electrical element-mounting substrate 1 has a flat plate shape, a lens holder 40 may be installed on the installation portion 12, as illustrated in FIG. 2. The lens holder 40 has an opening 40a. A lens 40b is installed in the lens holder 40.

The second substrate 20 includes an organic resin as an insulating base member (second base member 20a). The second substrate 20 is layered on the first substrate 10. The second substrate 20 is layered on the second surface 102 located on the side opposite to the first surface 101 of the first substrate 10 where the first mounting region is present. Hereinafter, a surface of the second substrate 20 facing the first substrate 10 is referred to as a third surface, and a surface opposite to the third surface is referred to as a fourth surface.

As described above, in the electrical element-mounting substrate 1 according to the present embodiment, the installation portion 12 for installing the lens holder 40 is located, in a plan view, around the mounting region 11 of the first substrate 10 including a ceramic as a base member. Therefore, as compared with the case where the lens holder 40 or the window material is installed on the organic base member, for example, the positional deviation of the lens and the deviation of the optical axis due to thermal deformation can be reduced. Thus, the durability of the electrical element-mounting substrate 1 and the electrical device 100 can be enhanced.

The imaging element 30 is mounted on the mounting region 11 (first mounting region) of the electrical element-mounting substrate 1. The imaging element 30 may be, for example, a complementary metal oxide semiconductor (CMOS), a charge coupled device (CCD), or the like.

The first base member 10a is, for example, a ceramic base member made using a ceramic as a material. The first base member 10a may be, for example, an alumina-based ceramic or a glass ceramic-based ceramic, or may be a dielectric such as cordierite, zirconia, barium titanate, strontium titanate, or calcium titanate, aluminum titanate, lead zirconate titanate (PZT), or the like. The first base member 10a may include, for example, a plurality of ceramics.

If necessary, a conductor layer (front surface conductor layer) may be formed on the front surface of the first base member 10a. The conductor layer may be, for example, a wiring line having a line shape, a pad having a circular shape, a quadrangular shape, or another angular shape, or a power supply layer or a ground layer having a solid shape. The area of the conductor located on the front surface of the first base member 10a may be smaller than the area of the main surface of the first substrate 10, for example.

Furthermore, the first substrate 10 may include a conductor layer (internal conductor layer) thereinside. An interlayer connection conductor that electrically connects the front surface conductor layer and the internal conductor layer may be further included. The material of the front surface conductor layer, the internal conductor layer, and the interlayer connection conductor may be, for example, tungsten (W), molybdenum (Mo), a mixture of W—Mo, an alloy of W—Mo, an intermetallic compound of W—Mo, copper, silver, or nickel. The front surface conductor layer, the internal conductor layer, and the interlayer connection conductor may include a common material such as ceramic powder.

The interlayer connection conductor may contain, for example, copper powder, tin (Sn) powder, or bismuth (Bi)

powder. The interlayer connection conductor may include, for example, the same material as that of the second base member 20a described below, such as an epoxy resin, as the remainder. The interlayer connection conductor preferably has a melting point closer to the heat-resistant temperature of the second substrate 20 made of an organic resin than to the heat-resistant temperature of the first base member 10a made of a ceramic.

The second base member 20a is, for example, a so-called organic base member including an organic material. The second base member 20a may be, for example, an epoxy resin, an acrylic resin, a polycarbonate resin, a polyimide resin, an olefin resin, or a polyphenylene resin. The second base member 20a may be, for example, a polytetrafluoro-ethylene (PTFE), another fluororesin, or a polyphenylene ether resin.

As described above, in the electrical element-mounting substrate 1 according to the present embodiment, the second substrate 20 constituting a part of the electrical element-mounting substrate 1 is made of an organic resin. Therefore, the weight of the electrical element-mounting substrate 1 and the weight of the electrical device 100 can be reduced as compared with the case where only the substrate using a ceramic as a base member is provided.

Second Embodiment

Figure 3:
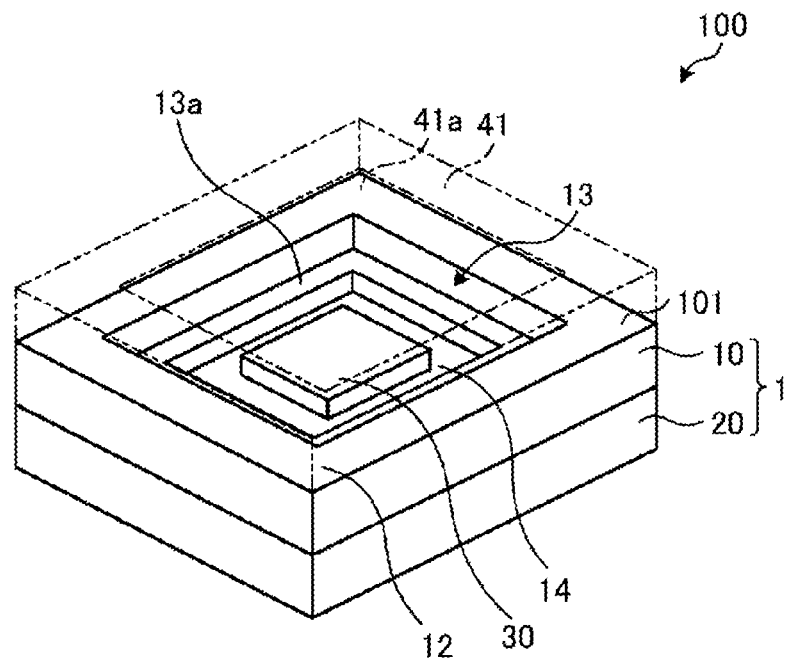
FIG. 3 is a perspective view illustrating an example of an electrical device according to a second embodiment.
Figure 4:
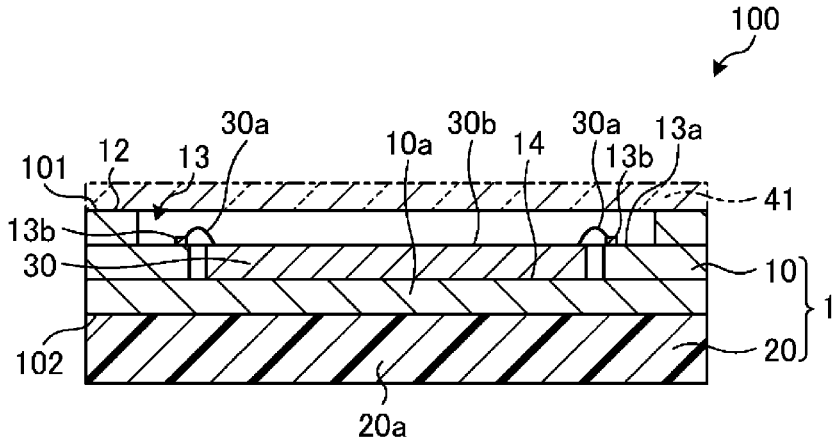
FIG. 4 is a cross-sectional view of the electrical device illustrated in FIG. 3.

FIG. 3 is a perspective view illustrating an example of the electrical device according to the second embodiment. FIG. 4 is a cross-sectional view of the electrical device illustrated in FIG. 3.

As illustrated in FIGS. 3 and 4, the electrical device 100 according to the second embodiment includes the electrical element-mounting substrate 1 and the imaging element 30. The electrical element-mounting substrate 1 includes the first substrate 10 and the second substrate 20. Also in this case, the electrical element-mounting substrate 1 serves as a substrate or a member where the imaging element 30 is mounted.

In the case of the electrical device 100 according to the second embodiment, the first substrate 10 included in the electrical element-mounting substrate 1 has a recessed portion 13. The recessed portion 13 is located in the center portion of the first substrate 10 so as to have an opening in the first surface 101 of the first substrate 10. In this case, a surface corresponding to the bottom of the recessed portion 13 is a bottom surface 14. In the electrical element-mounting substrate 1 according to the second embodiment, the bottom surface 14 is a portion corresponding to the mounting region 11 (first mounting region). As illustrated in FIGS. 3 and 4, the imaging element 30 is mounted on the bottom surface 14 of the recessed portion 13.

In the electrical element-mounting substrate 1 according to the second embodiment, the installation portion 12 for installing the lens holder 40 or a window material 41 is located around the bottom surface 14 on which the imaging element 30 is mounted, in a plan view. The installation portion 12 is provided on the first surface 101 of the electrical element-mounting substrate 1. The installation portion 12 and the bottom surface 14 on which the imaging element 30 is mounted are located at different positions in the height direction when the electrical element-mounting substrate 1 is viewed in a vertical cross section. In the case of the electrical element-mounting substrate 1 according to the second embodiment, the imaging element 30 can be disposed in the recessed portion 13. The position of the upper surface of the imaging element 30 can be located at a position lower than the position in the height direction of the first surface 101 of the electrical element-mounting substrate 1. For example, a flat plate-shaped window material 41 can be used for the installation portion 12. The electrical device 100 according to the second embodiment has a structure in which the imaging element 30 does not protrude from the first surface 101 of the electrical element-mounting substrate 1. As a result, the imaging element 30 is less likely to be externally and mechanically damaged, and high reliability can be obtained.

The window material 41 may be a light-transmissive member such as glass. A window 41a, which is a region through which imaging can be performed by the imaging element 30, is located inside the installation portion 12. Instead of the window material 41, the lens holder 40 may be installed.

As described above, even in a case where the first substrate 10 has the recessed portion 13, the installation portion 12 on which the window material 41 or the lens holder 40 is installed can be located around the bottom surface 14 on which the imaging element 30 is mounted, in a plan view. Therefore, as compared with the case where the window material 41 or the lens holder 40 is installed on the organic base member, for example, the positional deviation of the window material 41 and the lens 40b and the deviation of the optical axis caused by the thermal deformation of the electrical element-mounting substrate 1 can be reduced. Thus, the durability of the electrical element-mounting substrate 1 and the electrical device 100 can be enhanced.

In addition, in a case where the first substrate 10 has a so-called cavity structure having the recessed portion 13, for example, a window material having a flat plate shape in which the entire surface is transparent can be used as the window material 41. Therefore, the light transmissivity is increased, and more video information can be captured.

Although the first substrate 10 having a layered structure is illustrated in FIG. 4, the recessed portion 13 may be provided in the first substrate 10 that is a single layer.

As illustrated in FIG. 4, in the electrical device 100 according to the second embodiment, a step 13a is provided between the first surface 101 and the bottom surface 14 in the depth direction of the recessed portion 13. In this case, when a terminal electrode 13b is provided on the step 13a, a bonding wire 30a extending from the imaging element 30 can be connected to the terminal electrode 13b. An upper surface 30b of the imaging element 30 and the step 13a are preferably equal or close to each other in height from the bottom surface 14. When the upper surface 30b of the imaging element 30 and the step 13a are similar in height, the length of the wire 30a from the imaging element 30 can be shortened. This makes it possible to reduce an increase in inductance due to the length of the wire 30a.

In the case of the electrical device 100 of the first embodiment and the electrical device 100 of the second embodiment described above, the Young's modulus of the first substrate 10 may be greater than the Young's modulus of the second substrate 20. Furthermore, the Young's modulus of the first substrate 10 may be greater than the Young's modulus of the window material 41. Furthermore, the Young's modulus of the first substrate 10 may be greater than the Young's modulus of the material of the lens holder 40. In other words, the Young's modulus of the window material 41 and the Young's modulus of the lens holder 40 may be smaller than the Young's modulus of the first substrate 10. The Young's modulus of the second substrate 20 may be smaller than the Young's modulus of the first substrate 10. In the electrical device 100, the window material 41, the first substrate 10, and the second substrate 20 are layered in this order. In such a layered structure, when the first substrate 10 having a high Young's modulus is disposed at the center position in a layering direction, the first substrate 10 located at the center in the layering direction serves as a base axis, so that the deformation of the entire electrical device 100 can be reduced. In this case, the Young's modulus may be measured by a measuring method using a sample piece cut out from the electrical device 100, or may be a value obtained by separately preparing a member corresponding to the composition of each base member and performing measurement on the member. The term "main component" as used herein refers to a component contained in the base member in the largest amount in terms of mass ratio or volume ratio.

Third Embodiment

Figure 5:
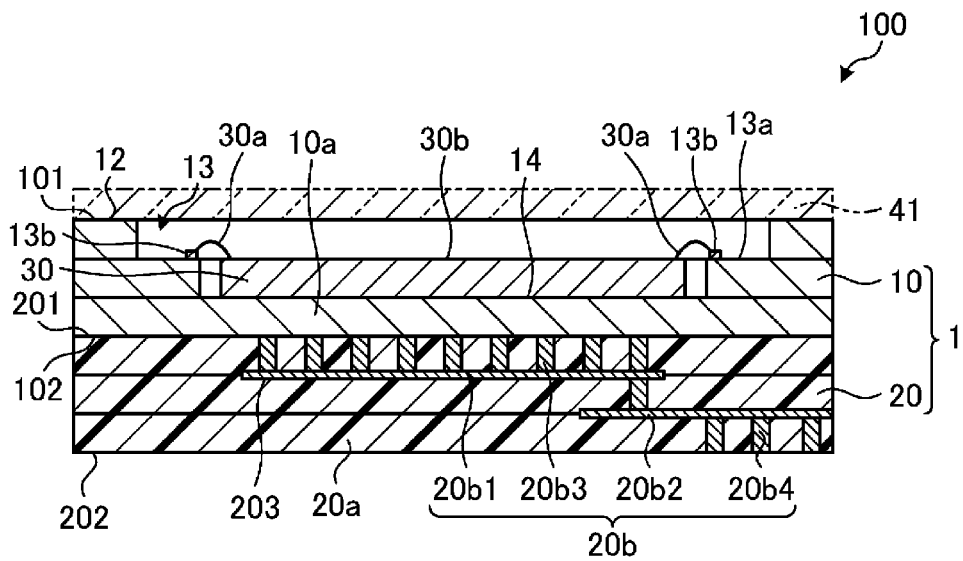
FIG. 5 is a cross-sectional view illustrating an example of an electrical device according to a third embodiment.

FIG. 5 is a cross-sectional view illustrating an example of the electrical device according to the third embodiment. First, also in the electrical device 100 according to the third embodiment, the electrical element-mounting substrate 1 has a configuration similar to those of the electrical element-mounting substrate 1 of the first embodiment and the electrical element-mounting substrate 1 of the second embodiment described above. That is, also in the case of the electrical device 100 according to the third embodiment, the electrical element-mounting substrate 1 is a layered body of the first substrate 10 and the second substrate 20. In addition, the mounting structure of the imaging element 30 on the electrical element-mounting substrate 1 is similar to that of the electrical device 100 of the second embodiment.

In the electrical device 100 of the third embodiment, the second substrate 20 includes a conductor 20b. The conductor 20b may be provided on the surfaces (surfaces 201 and 202) of the second substrate 20 and in an inner portion 203 thereof. As illustrated in FIG. 5, the conductor 20b may be disposed extending from the surface 201, which is one of the surfaces of the second substrate 20, to the surface 202, which is the other of the surfaces of the second substrate 20.

In this case, the conductor 20b located on the second substrate 20 may have a width or diameter smaller than a width or diameter of the conductor located on the first substrate 10. For example, in the case where the conductor 20b includes internal conductor layers 20b1 and 20b2 and interlayer connection conductors 20b3 and 20b4, the widths of the internal conductor layers 20b1 and 20b2 and/or the diameters of the interlayer connection conductors 20b3 and 20b4 may be smaller than the width of the front surface conductor layer located on the first substrate 10 and/or the diameter of the interlayer connection conductor located on the first substrate 10. In that case, for example, heat is less likely to be transferred from the second substrate 20 side to the first substrate 10 side via the conductor.

Fourth Embodiment

Figure 6:
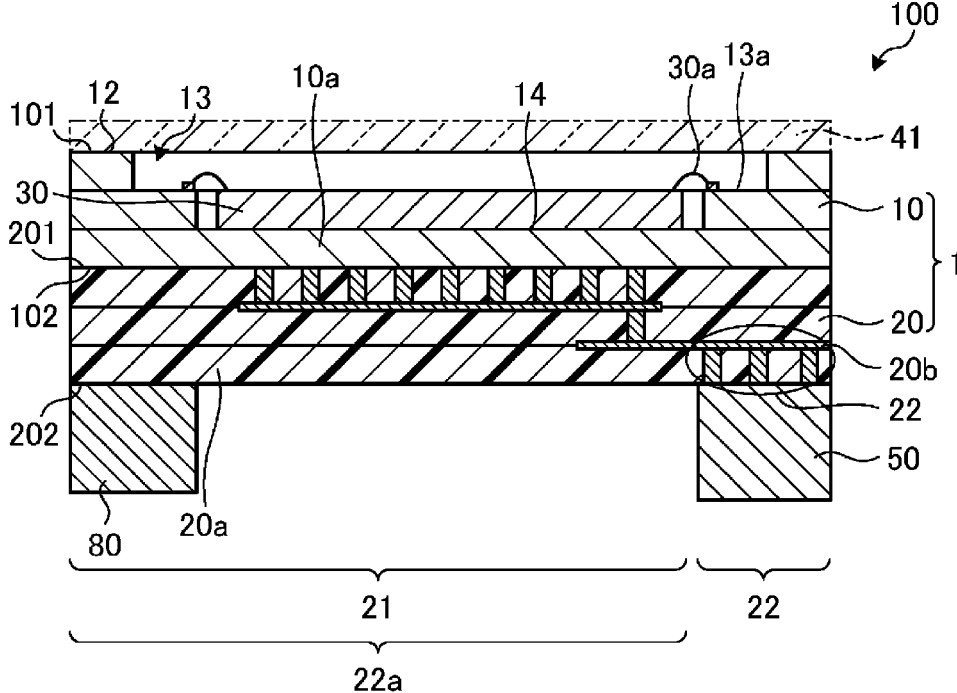
FIG. 6 is a cross-sectional view illustrating an example of an electrical device according to a fourth embodiment.

FIG. 6 is a cross-sectional view illustrating an example of the electrical device according to the fourth embodiment. In the electrical device 100 according to the fourth embodiment, the second substrate 20 includes a heat dissipation portion 22. The heat dissipation portion 22 is a portion close to the surface 202 in the second substrate 20. The heat dissipation portion 22 may have a higher volume fraction of the conductor 20b than the other region 22a in the surface 202 of the second substrate 20. In this case, the heat dissipation portion 22 of the second substrate 20 has a higher heat dissipation capability than the other region 22*a*. The heat dissipation portion 22 may be disposed surrounding the peripheral edge portion of the surface 202 of the second substrate 20. Thus, the heat dissipation from the second substrate 20 can be further enhanced.

A central region 21 of the second substrate 20 excluding the heat dissipation portion 22 may be used as a mounting portion of an electrical element in the second substrate 20. In the heat dissipation portion 22, the conductor 20*b* may be disposed extending from the surface 201 of the second substrate 20 in contact with the first substrate 10 to the surface 202 of the second substrate 20 located on the opposite side of the surface 201, in the thickness direction of the second substrate 20, and toward the outside of the surface 202.

That is, the central region 21 is a region which is located in the center portion of the surface 202 as the main surface of the second substrate 20 and in which an electrical element is mounted. The heat dissipation portion 22 is a portion that is located around the region 21 and in which heat is dissipated. In the heat dissipation portion 22, the conductor 20*b* located on the second substrate 20 may be exposed on the surface 202. Heat transferred from the imaging element 30 via the first substrate 10 is dissipated from the surface of the heat dissipation portion 22 to the surface 202 where the conductor 20*b* is exposed. In this manner, in the electrical device 100 of the fourth embodiment, for example, heat can be dissipated from the first substrate 10 side to the second substrate 20 side. Even when an electrical element is mounted in the central region 21, heat is likely to flow to the heat dissipation portion 22 side around the central region 21. Therefore, occurrence of a failure due to inflow of heat to the electrical element can be suppressed.

In addition, the electrical device 100 according to the present embodiment may include a heat collection member 50 on the surface 202 serving as the heat dissipation portion 22. For example, the heat collection member 50 is located at a position of the heat dissipation portion 22 of the second substrate 20 located around the central region 21 (second mounting region). The heat collection member 50 is in contact with the surface 202 of the second substrate 20. The heat collection member 50 is, for example, a member made of a metal. With the heat collection member 50, heat that has been conducted through the conductor 20*b* can be collected and released to the outside air. By thus providing the heat collection member 50, for example, heat mainly derived from the imaging element 30 can be dissipated in a mode in which the influence of heat on other electrical elements can be further reduced from the first substrate 10 side to the second substrate 20 side. The heat dissipation portion 22 or the heat collection member 50 may be located surrounding the region 21. The heat dissipation portion 22 or the heat collection member 50 may be a wall member surrounding the region 21 from four sides. When the heat dissipation portion 22 or the heat collection member 50 has a structure serving as a wall member surrounding the region 21 from four sides, for example, a function of protecting an electrical element 60 mounted in the region 21, which will be described below, from a mechanical impact or the like can be provided. In this case, the height of the heat dissipation portion 22 or the heat collection member 50 is preferably higher than the height of the electrical element 60.

Furthermore, the electrical device 100 according to the present embodiment may include a connector 80 for electrical connection to an external power supply. When the heat collection member 50 has a divided structure, a part of the heat collection member 50 may be used as the connector 80.

Fifth Embodiment

Figure 7A:
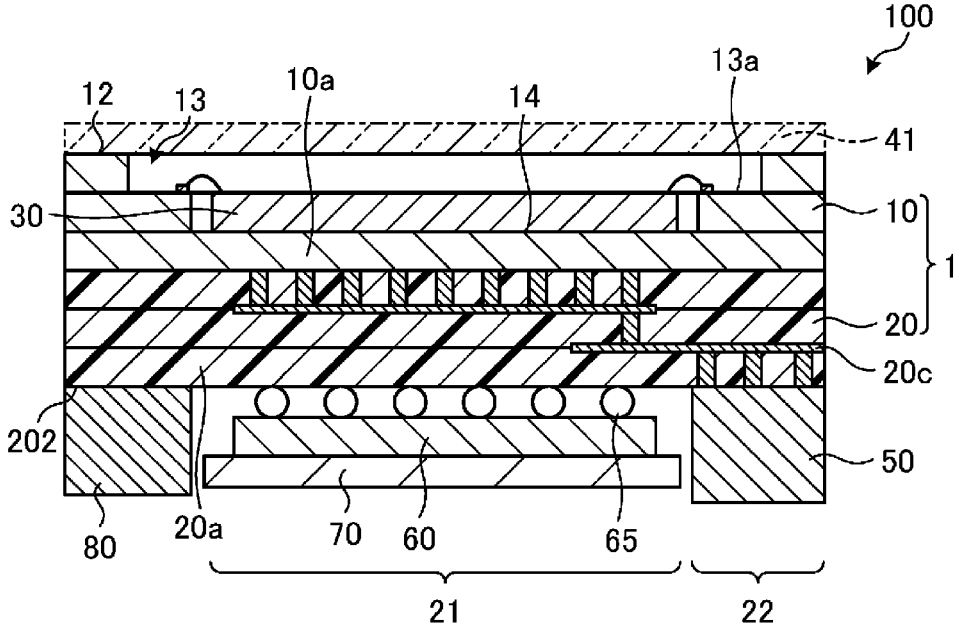
FIG. 7A is a cross-sectional view illustrating an example of an electrical device according to a fifth embodiment.

FIG. 7A is a cross-sectional view illustrating an example of the electrical device according to the fifth embodiment. The electrical device 100 according to the fifth embodiment includes the electrical element 60 located on the surface 202 side of the second substrate 20. The electrical element 60 is located in the region 21 and is bonded to the surface 202 in the region 21 via a bonding material 65. The electrical element 60 may be, for example, a semiconductor element for signal processing. The bonding material 65 has, for example, conductivity, and may electrically connect the second substrate 20 and the electrical element 60. In the case of the electrical device 100 according to the fifth embodiment, the imaging element 30 is disposed on the bottom surface 14 of the recessed portion 13 of the first substrate 10. Furthermore, the surface 202 of the second substrate 20 layered on the first substrate 10 is provided with the electrical element 60. The imaging element 30 and the electrical element 60 have an overlapping portion in a plane perspective. Even if the area of the imaging element 30 is different from the area of the electrical element 60, one of the imaging element 30 and the electrical element 60 is preferably entirely within the plane of the other element. As a result, the wiring line length between the imaging element 30 and the electrical element 60 can be set to, at shortest, a length corresponding to the thickness obtained by layering the first substrate 10 and the second substrate 20, and thus the electrical device 100 having a small inductance can be obtained.

A relative dielectric constant of the second base member 20*a* of the second substrate 20 may be smaller than a relative dielectric constant of the first base member 10*a* of the first substrate 10. In that case, for example, even when an electrical element having a high operating frequency is disposed on the second substrate 20 side rather than the first substrate 10 side, the signal delay can be reduced.

Furthermore, the electrical device 100 may include a heat dissipation member 70. The heat dissipation member 70 is provided on the surface of the electrical element 60 opposite to the surface on which the bonding material 65 is provided. The heat dissipation member 70 has a function of quickly dissipating heat generated in the electrical element 60. In this manner, the heat generated in the electrical element 60 is less likely to be transferred to the imaging element 30 side through the electrical element-mounting substrate 1. Therefore, for example, the positional deviation of the lens and the deviation of the optical axis due to the thermal deformation can be reduced as compared with the case where the heat dissipation member 70 is not provided. Thus, the durability of the electrical element-mounting substrate 1 and the electrical device 100 can be enhanced. The heat dissipation member 70 may be, for example, a heat dissipation plate. Furthermore, the heat dissipation member 70 may include, for example, a heat sink or a fin member. When the heat sink is a solid body, a fin member may be layered on the heat sink.

Furthermore, also in the case of the electrical element-mounting substrate 1 included in the electrical device 100 according to the fifth embodiment, similarly to the electrical element-mounting substrate 1 included in the electrical device 100 according to the fourth embodiment, the second substrate 20 preferably includes the conductor 20*b*, and a part of the conductor 20*b* forms the heat dissipation portion 22 in the peripheral edge portion of the surface 202. In the case of the electrical element-mounting substrate 1 included in the electrical device 100 according to the fifth embodiment, the second substrate 20 may include a metal member thereinside.

Such a metal member 20c may be a member that is disposed separately from the conductor 20b, is not energized, and only contributes to heat dissipation. That is, although the metal member 20c located inside the second substrate 20 includes a portion exposed on the side surface of the second substrate 20, the metal member 20c is preferably insulated from the conductor 20b included in an electrical circuit. Accordingly, heat can be dissipated in a mode in which the influence of heat on other electronic elements can be further reduced from the first substrate 10 side to the second substrate 20 side.

The materials of the conductor 20b and the metal member 20c included in the second substrate 20 may be, for example, the same as the material of the conductor included in the first substrate 10. Also, the conductor 20b and the metal member 20c may have similar shapes and sizes.

Figure 7B:
FIG. 7B is a cross-sectional view illustrating another example of the electrical device according to the fifth embodiment.
Figure 7B:
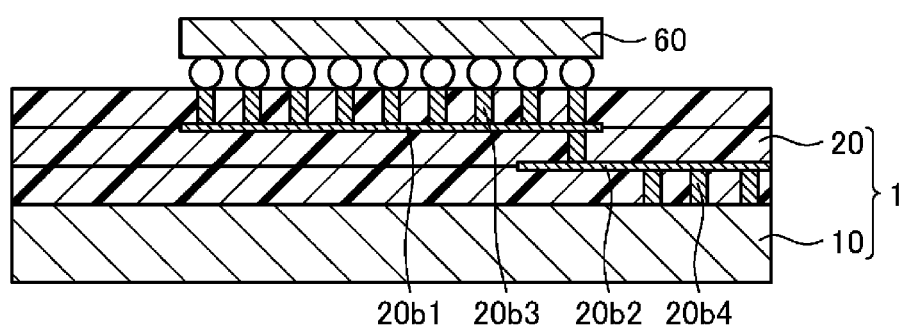

In addition, the configuration of FIG. 7A may be a configuration in which the electrical element 60, the second substrate 20, and the first substrate 10 are layered in this order. FIG. 7B is a cross-sectional view illustrating another example of the electrical device according to the fifth embodiment.

As illustrated in FIG. 7B, the electrical element 60 may be disposed in the mounting region of the second substrate 20. In addition, the first substrate 10 may be disposed on the side opposite to the surface of the second substrate 20 provided with the electrical element 60.

The second substrate 20 may include a mounting region for mounting the electrical element 60 on one main surface. The first substrate 10 may be disposed on the main surface of the second substrate 20 opposite to the surface provided with the electrical element 60.

In this case, the Young's modulus of the second substrate 20 may be smaller than the Young's modulus of the first substrate 10. When the second substrate 20 having a smaller Young's modulus is a substrate where the electrical element 60 is mounted, the stress on the electrical element 60 is reduced, and the failure probability can be reduced. This makes it possible to help avoid the electrical element 60 and the electrical element-mounting substrate 1 from breaking down even when the electrical element-mounting substrate 1 is placed in a severe temperature environment such as an extremely low temperature environment.

In addition, the arrangement of the conductor 20b may be reversed in the layering direction from the case of FIG. 7A. That is, of the conductor 20b of the second substrate 20, the conductor at the center portion where the internal conductor layer 20b1 and the interlayer connection conductor 20b3 are connected may be located on the side of the mounting region where the electrical element 60 is mounted, when the electrical element-mounting substrate 1 is viewed in the layering direction.

On the other hand, the conductor where the internal conductor layer 20b2 and the interlayer connection conductor 20b4 are connected may be located closer to the surface opposite to the mounting region where the electrical element 60 is mounted, when the electrical element-mounting substrate 1 is viewed in the layering direction. In this case, the conductor where the internal conductor layer 20b2 and the interlayer connection conductor 20b4 are connected may be located around the mounting region when the electrical element-mounting substrate 1 is viewed in a plane perspective.

The conductor where the internal conductor layer 20b2 and the interlayer connection conductor 20b4 are connected may extend stepwise in the layering direction of the electrical element-mounting substrate 1 from the conductor at the center portion where the internal conductor layer 20b1 and the interlayer connection conductor 20b3 are connected, when the electrical element-mounting substrate 1 is viewed in a vertical cross section.

In this case, the conductor in the center portion where the internal conductor layer 20b1 and the interlayer connection conductor 20b3 are connected and the conductor where the internal conductor layer 20b2 and the interlayer connection conductor 20b4 are connected are preferably connected to each other for the reason that thermal conductivity therebetween can be increased. Heat generated by the electrical element 60 can be dissipated from the outside of the electrical element-mounting substrate 1 by the conductor in the center portion where the internal conductor layer 20b1 and the interlayer connection conductor 20b3 are connected and the conductor where the internal conductor layer 20b2 and the interlayer connection conductor 20b4 are connected. As a result, the driving of the electrical element 60 can be stabilized. Here, the outside of the electrical element-mounting substrate 1 means including the direction of the side surface of the substrate in addition to the thickness direction from the mounting region of the electrical element-mounting substrate 1 to the opposite side.

The electrical element 60 may be, for example, at least one selected from the group consisting of a circuit element represented by a large-scale integrated circuit (LSI), a switch ASIC element, a superconducting element (Josephson element), a surface-acoustic-wave (SAW) element, a light-emitting element, a logic element, a Hall element, a light receiving element, a piezoelectric element, a Peltier element, and a metal-film resistive element. Even in these cases, the electrical element-mounting substrate 1 having high durability can be obtained.

Other Embodiments

In each of the embodiments described above, the first substrate 10 and the second substrate 20 may have the same area in a plan view. Accordingly, the second substrate 20 can be located overlapping the entire second surface 102 on the opposite side to the first surface 101 on which the first mounting region of the first substrate 10 is present. As a result, when both the first substrate 10 and the second substrate 20 are layered, local warpage is less likely to occur. Therefore, the durability of the electrical element-mounting substrate 1 and the electrical device 100 can be enhanced.

That is, the first substrate 10 and the second substrate 20 may overlap each other with the same shape and the same size in a plane perspective. When the first substrate 10 and the second substrate 20 overlap each other with the same shape and the same size in a plane perspective, the effect of making the local deformation of the first substrate 10 and the second substrate 20 less likely to occur can be enhanced. For example, in the case where the first substrate 10 and the second substrate 20 overlap each other and the area of the first substrate 10 is greater than the area of the second substrate 20, deformation due to the portion of the first substrate 10 protruding from the second substrate 20 is likely to occur. In addition, when the area of the second substrate 20 is greater than the area of the first substrate 10, deformation due to the portion of the second substrate 20 protruding from the first substrate 10 is likely to occur. The presence of the protruding portion of one of the substrates is likely to cause deformation. Therefore, the side surface of the first substrate 10 and the side surface of the second substrate 20 preferably overlap each other so as to be flush with each other. In this case, referring to FIG. 1, the first substrate 10 and the second substrate 20 are preferably arranged such that the four side surfaces of the first substrate 10 are flush with the corresponding four side surfaces of the second substrate 20 disposed in the layering direction.

In each of the above-described embodiments, the first substrate 10 and the second substrate 20 may be bonded to each other by a resin component contained in the second substrate 20. As a result, a component other than the components contained in the first substrate 10 and the second substrate 20 is less likely to be present at the layering interface between the first substrate 10 and the second substrate 20, and thus the thermal conductivity between first substrate 10 and the second substrate 20 can be increased.

Manufacturing Method of Electrical Element-Mounting Substrate

Next, an example of a method of manufacturing the electrical element-mounting substrate 1 according to the embodiment will be described.

First, a method of manufacturing the first substrate 10 including an insulating base member made of a ceramic will be described. The final shape can be a 10 mm square and have a thickness t of 1 mm (5 insulating layers each having a thickness of 0.2 mm), for example. The diameter (via diameter) of the interlayer connection conductor penetrating through each insulating layer may be, for example, 200 μm.

First, a pattern sheet in which a conductor pattern including a via is formed on a green sheet made of a ceramic (ceramic green sheet) is prepared. Examples of the ceramic green sheet include a ceramic material containing alumina as a main component and a glass ceramic.

As the ceramic material containing alumina as a main component, for example, a material obtained by adding 10 to 20 parts by mass of $SiO_2$ and MgO to 100 parts by mass of a raw material powder of alumina can be used. In addition, an additive such as MnO may be further added. $SiO_2$ and MgO are preferably in the same amount. The content of MnO is preferably $\frac{1}{10}$ to $\frac{1}{2}$ of the total amount of $SiO_2$ and MgO in terms of mass ratio.

As the glass ceramic, for example, borosilicate glass containing inorganic particles of alumina, silica, or the like can be used.

In the conductor pattern, the type of metal powder used as a main component is different between the ceramic material containing alumina as a main component and the glass ceramic. For example, in the case of the ceramic green sheet formed of a ceramic material containing alumina as a main component, a conductor paste containing, for example, tungsten (W) or molybdenum (Mo) may be used as the material of the conductor pattern because co-firing is possible.

In the ceramic green sheet formed of a glass ceramic, a metal material, such as copper or silver, which is sintered at a lower temperature than tungsten or molybdenum, is preferably used as the conductor pattern.

From the viewpoint that the transmission characteristics of the conductor can be enhanced, the pattern sheet may be formed by combining, for example, a conductor paste containing copper or silver having a high electrical conductivity as a main component and a glass ceramic.

The pattern sheets thus obtained are layered and fired. At this time, the ceramic material containing alumina as a main component is preferably fired, for example, under a condition of 1500° C. to 1800° C., and the ceramic material containing a glass ceramic as a main component is preferably fired, for example, under a condition of 800° C. to 1100° C.

If necessary, a plating film of Ni, Au, or the like may be formed on the surface of the conductor exposed on the surface of the first substrate 10.

In that case, the first substrate 10 according to each embodiment is formed. Note that, for example, an inorganic or organic adhesive may be located at a portion to which the window material 41 (see FIGS. 3 and 4) is attached.

Next, a method of manufacturing the second substrate 20 including an insulating base member made of an organic resin will be described. The final shape can be a 10 mm square and have a thickness t of 0.2 mm (2 insulating layers each having a thickness of 0.1 mm), for example. The diameter (via diameter) of the interlayer connection conductor penetrating through each insulating layer may be, for example, 200 μm. For example, a copper foil having a thickness of 18 μm may be used as the metal member of the second substrate 20.

First, a varnish is prepared by adding an inorganic filler such as silica to an epoxy resin, and a green sheet is prepared.

Next, a conductor is formed on the prepared green sheet. Among the conductors, a via conductor located in the thickness direction of the green sheet can be formed, for example, by making a through hole penetrating the green sheet in the thickness direction and then filling the inside of the formed through hole with a conductor paste. As the conductor paste in this case, for example, composite metal powder obtained by adding and mixing a low melting point metal to copper or silver powder is preferably used. Examples of the low melting point metal material include tin (Sn), solder (Sn—Pb), bismuth (Bi), and antimony (Sb).

The conductor paste may contain, as a binder, one or more organic resins selected from the group consisting of an epoxy resin, an acrylic resin, a polyethylene resin, and the like. The amount of the binder is preferably 1 to 20 parts by mass with respect to 100 parts by mass of the metal component.

In addition, among the conductors, as the ground layer and the wiring line, a copper foil pattern formed by etching a copper foil may be used. The copper foil pattern may be processed into a pattern shape by performing each treatment of exposure and development in a state where the copper foil is attached to the resin film. The copper foil pattern obtained by patterning is transferred to the green sheet. The transfer can be performed, for example, by attaching the copper foil pattern to the green sheet and then peeling off the resin film serving as the base member.

In this manner, the green sheet (pattern sheet) on which a via conductor and a copper foil pattern are formed is prepared. The pattern sheet is layered in a raw state on the back surface (for example, the second surface 102 illustrated in FIG. 4) side of the first substrate 10. Next, for example, a layered body is prepared by processing under conditions of a temperature of 70° C., pressures of about 1 MPa to 5 MPa, and heating time of 20 seconds to 30 seconds. The prepared layered body is cured at 200° C. to 250° C. for 2 hours to 4 hours. If necessary, plating (Ni, Au, or the like) may be formed on the surface of the conductor.

Furthermore, on the second substrate 20, a solder resist may be formed in a region other than the copper foil pattern.

In the above-described manner, the second substrate 20 according to each embodiment is formed, and the electrical element-mounting substrate 1 in which the first substrate 10 and the second substrate 20 are layered is manufactured.

EXPERIMENTAL EXAMPLE

Figure 8:
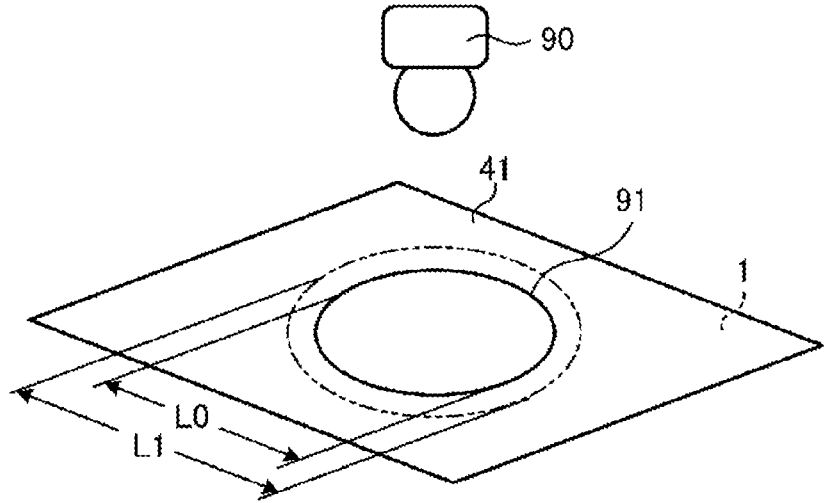
FIG. 8 is an explanatory view illustrating a method of evaluating an electrical element-mounting substrate.

The electrical element-mounting substrates 1 according to Samples 1 to 3 described below were prepared, and characteristics thereof were evaluated.
Preparation of Sample 1
FIG. 8 is an explanatory view illustrating a method of evaluating the electrical element-mounting substrate. First, the electrical element-mounting substrate 1 (10 mm square) illustrated in FIGS. 3 and 4 was prepared, and a 0.1-mm-thick glass plate was attached thereto, as the window material 41. As the adhesive, an epoxy resin was used.
A ring 91 was formed at the center portion of the window material 41 using an Ag paste such that the outer diameter (the diameter)=5 mm and the inner diameter=3 mm.
Preparation of Sample 2
Sample 2 was prepared in the same manner as Sample 1 except that the electrical element-mounting substrate disclosed in Patent Document 1 was used. Specifically, an electrical element-mounting substrate including a first substrate having a recessed portion in the upper surface and containing an organic material, and a second substrate located in the recessed portion of the first substrate, including a mounting region on an upper surface on which an imaging element is mounted, and containing an inorganic material was prepared, and the window material 41 was attached to the electrical element-mounting substrate.
Preparation of Sample 3
Sample 3 was obtained in the same manner as Sample 1 except that the materials of the first substrate 10 and the second substrate 20 were switched, the insulating base member of the first substrate 10 was changed to an organic resin, and the insulating base member of the second substrate 20 was changed to a ceramic.
Evaluation
The electrical element-mounting substrate 1 was heated by a heater to change the temperature from room temperature (25° C.) to 100° C. while the electrical element-mounting substrate 1 to which the window material 41 was attached was irradiated with light from the light source 90 disposed on the window material 41 side, and the degree of deformation of the window material 41 was evaluated from the change in size of the ring 91 formed in the window material 41. The change in the size of the ring 91 was evaluated by the expansion coefficient. To be specific, when the outer diameter of the ring 91 in the initial state is L0 (mm) and the outer diameter of the ring 91 after the evaluation test is L1 (mm), (L1−L0)/L0×100(%) was calculated.
In the electrical element-mounting substrate 1 of Sample 1, the expansion coefficient of the ring 91 was 0.7%. On the other hand, the expansion coefficients of the ring 91 in the electrical element-mounting substrates of Samples 2 and 3 were 4% and 6%, respectively. In the sample 1, since the window material 41 is fixed to the first substrate 10 including the insulating base member made of a ceramic, it is presumable that the window material 41 is less likely to be deformed compared with the samples 2 and 3 in which the window material 41 is fixed to the substrate including the organic resin as the insulating base member.
As described above, the electrical element-mounting substrate 1 according to the embodiment includes the first substrate 10 including the ceramic as the first base member 10a and the second substrate 20 including the organic resin as the second base member 20a. The first substrate 10 includes a first mounting region (for example, the mounting region 11) for mounting an electrical element (for example, the imaging element 30) and the installation portion 12 for installing the lens holder 40 or the window material 41. The first mounting region is located on the upper surface of the first substrate 10. The installation portion 12 is located around the first mounting region in a plan view. The second substrate 20 is layered on the surface of the first substrate 10 located on the side opposite to the first mounting region.
Therefore, with the electrical element-mounting substrate 1 of the embodiment, the durability is improved.
Additional effects and other aspects can be easily derived by a person skilled in the art. Thus, a wide variety of aspects of the present disclosure are not limited to the specific details and representative embodiments represented and described above. Accordingly, various changes are possible without departing from the spirit or scope of the general inventive concepts defined by the appended claims and their equivalents.

REFERENCE SIGNS

1 Electrical element-mounting substrate
10 First substrate
10a First base member
11 Mounting region (first mounting region)
12 Installation portion
13 Recessed portion
14 Bottom surface
20 Second substrate
20a Second base member
21 Region
30 Imaging element
40 Lens holder
41 Window material
50 Heat collection member
60 Electrical element
70 Heat dissipation member
80 Connector
100 Electrical device
The invention claimed is:
1. An electrical element-mounting substrate comprising:
a first substrate comprising a ceramic as a first base member; and
a second substrate comprising an organic resin as a second base member, wherein
the first substrate comprises a first surface and a second surface opposite to the first surface,
the first surface comprises a first mounting region where a first electrical element is mounted and an installation portion where a lens holder or a window material is installed,
the installation portion is located around the first mounting region in a plan view, and
the second substrate is located on the second surface of the first substrate by a resin component contained in the second substrate without an adhesive member or bonding member interposed therebetween.
2. The electrical element-mounting substrate according to claim 1, wherein
the first substrate comprises a recessed portion in the first surface, and
the first mounting region is located on a bottom surface of the recessed portion.
3. The electrical element-mounting substrate according to claim 2, wherein a step is provided between the first surface and the bottom surface in the depth direction of the recessed portion.

4. The electrical element-mounting substrate according to claim 1, wherein the first substrate and the second substrate have the same area in a plan view.

5. The electrical element-mounting substrate according to claim 1, wherein the second base member has a relative dielectric constant smaller than a relative dielectric constant of the first base member.

6. The electrical element-mounting substrate according to claim 5, wherein a conductor located on the second substrate has a width or diameter smaller than a width or diameter of a conductor located on the first substrate.

7. The electrical element-mounting substrate according to claim 1, wherein the second substrate comprises a third surface facing the second surface and a fourth surface opposite to the third surface, and the fourth surface comprises a second mounting region which is located in a center portion and in which an electrical element is mounted, and a heat dissipation portion located around the second mounting region.

8. The electrical element-mounting substrate according to claim 7, wherein the second substrate comprises a heat collection member located around the second mounting region.

9. The electrical element-mounting substrate according to claim 8, wherein the heat dissipation portion or the heat collection member is a wall member that surrounds the second mounting region from four sides.

10. The electrical element-mounting substrate according to claim 7, wherein a conductor extends from the third surface in contact with the second surface to a portion of the fourth surface in a thickness direction of the second substrate toward the portion of the fourth surface, and the heat dissipation portion has a higher volume fraction of the conductor at the portion of the fourth surface than an other region in the fourth surface of the second substrate.

11. The electrical element-mounting substrate according to claim 10, wherein the heat dissipation portion is arranged so that the conductor extends in a direction from the third surface to the fourth surface of the second substrate and in a direction from the center portion of the fourth surface to outside.

12. An electrical device comprising:

the electrical element-mounting substrate according to claim 1; and an imaging element.

13. The electrical element-mounting substrate according to claim 1, wherein the lens holder is arranged on the first substrate.

14. The electrical element-mounting substrate according to claim 1, wherein the lens holder or the window material, the first substrate and the second substrate are arranged in this order.

15. The electrical element-mounting substrate according to claim 14, wherein the Young's modulus of the first substrate is higher than the respective Young's modulus of the second substrate, the lens holder and the window material.

16. The electrical element-mounting substrate according to claim 1, wherein the first substrate and the second substrate each have a side surface, and the side surface of the first substrate and the side surface of the second substrate overlap each other so as to be flush with each other.

17. The electrical element-mounting substrate according to claim 1, wherein the first substrate and the second substrate each have four sides, and the first substrate and the second substrate are arranged such that the four side surfaces of the first substrate are flush with the corresponding the four side surfaces of the second substrate disposed in a layering direction.

18. The electrical element-mounting substrate according to claim 1, wherein the second substrate includes a second mounting area on a surface opposite the first substrate for mounting a second electrical element, and the Young's modulus of the second substrate is lower than the Young's modulus of the first substrate.

19. An electrical element-mounting substrate comprising:

a first substrate comprising a ceramic as a first base member, a first surface and a second surface opposite to the first surface, wherein the first surface comprises a first mounting region where a first electrical element is mounted and an installation portion where a lens holder or a window material is installed, and wherein the installation portion is located around the first mounting region in a plan view; and a second substrate located on the second surface of the first substrate, and comprising an organic resin as a second base member, a third surface facing the second surface, and a fourth surface opposite to the third surface, wherein the fourth surface comprises a second mounting region which is located in a center portion and in which an electrical element is mounted, and a heat dissipation portion located around the second mounting region, wherein a conductor extends from the third surface in contact with the second surface to a portion of the fourth surface in a thickness direction of the second substrate toward the portion of the fourth surface, and wherein the heat dissipation portion has a higher volume fraction of the conductor at the portion of the fourth surface than an other region in the fourth surface of the second substrate.

* * * * *